(12) United States Patent
Baek

(10) Patent No.: US 8,106,450 B2
(45) Date of Patent: Jan. 31, 2012

(54) SEMICONDUCTOR DEVICE HAVING A SADDLE FIN SHAPED GATE AND METHOD FOR MANUFACTURING THE SAME

(75) Inventor: Seung Joo Baek, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 173 days.

(21) Appl. No.: 12/467,351

(22) Filed: May 18, 2009

(65) Prior Publication Data

US 2010/0219470 A1 Sep. 2, 2010

(30) Foreign Application Priority Data

Feb. 27, 2009 (KR) .......................... 10-2009-0016599

(51) Int. Cl.
*H01L 27/088* (2006.01)
*H01L 21/8234* (2006.01)

(52) U.S. Cl. .................. 257/334; 257/330; 257/E27.06; 257/E21.629; 438/587; 438/270

(58) Field of Classification Search .......... 257/330–334, 257/E21.629, E27.06
See application file for complete search history.

(56) References Cited

U.S. PATENT DOCUMENTS

| 7,306,993 | B2* | 12/2007 | Kim | 438/282 |
| 7,432,155 | B2* | 10/2008 | Park | 438/259 |
| 7,824,983 | B2* | 11/2010 | Juengling | 438/270 |
| 2006/0113590 | A1* | 6/2006 | Kim et al. | 257/330 |
| 2008/0023754 | A1* | 1/2008 | Baek | 257/330 |
| 2008/0036016 | A1* | 2/2008 | Lee et al. | 257/401 |
| 2008/0079067 | A1* | 4/2008 | Han et al. | 257/330 |

FOREIGN PATENT DOCUMENTS

| KR | 10-0640159 B1 | 10/2006 |
| KR | 1020060104879 B1 | 10/2006 |
| KR | 100854502 B1 | 8/2008 |
| KR | 1020080112658 A | 12/2008 |
| KR | 1020090001392 A | 1/2009 |

OTHER PUBLICATIONS

See attached English translation of Korean patent publication 1020090001392 of record.*

* cited by examiner

*Primary Examiner* — N Drew Richards
*Assistant Examiner* — Mamadou Diallo
(74) *Attorney, Agent, or Firm* — Ladas & Parry LLP

(57) ABSTRACT

A semiconductor device having a saddle fin gate and a method for manufacturing the same are presented. The semiconductor device includes a semiconductor substrate, an isolation structure, and gates. The semiconductor substrate is defined with first grooves in gate forming areas. The isolation structure is formed in the semiconductor substrate and is defined with second grooves which expose front and rear surfaces of the gate forming areas. The gates are formed within the first grooves in the gate forming areas. Gates are also formed in the second grooves of the isolation structure to cover the exposed front and rear surfaces of the gate forming areas. The second grooves are wider at the lower portions that at the upper portions.

2 Claims, 26 Drawing Sheets

SEMICONDUCTOR DEVICE HAVING A SADDLE FIN SHAPED GATE AND METHOD FOR MANUFACTURING THE SAME

CROSS-REFERENCE TO RELATED APPLICATIONS

The present application claims priority to Korean patent application number 10-2009-0016599 filed on 27 Feb. 2009, which is incorporated herein by reference in its entirety.

BACKGROUND OF THE INVENTION

The present invention relates to a semiconductor device and a method for manufacturing the same, and more particularly, to a semiconductor device having a saddle fin shaped gate that exhibits improved transistor characteristics and a corresponding method for manufacturing the same.

As the high integration of a semiconductor device proceeds to an ever higher degree of integration, the transistor channel lengths and widths decrease and the doping concentrations of junction regions at the source and drain regions increase. As a result junction leakage current increase because strong electric fields develop, a charge sharing phenomenon between the junction regions increasingly occurs, and the controllability of transistors is degraded. Accordingly, a threshold voltage abruptly decreases which is caused by short channel effects.

Therefore, it is difficult to develop a highly integrated semiconductor device that can achieve an adequate threshold voltage by using conventional planar channel structure designs for transistors. Furthermore, since gate-induced drain leakage (GIDL) increases due to the development of strong electric fields in the junction regions, then limitations necessarily arise when trying to improve on the refresh characteristics of a semiconductor device.

Under these circumstances, transistors having a three-dimensional fin channel structure have been proposed as promising candidates that may be capable of increasing the channel area while not suffering from some or all of the above noted deficiencies of high integration transistors. In fin transistor, a partial thickness of portions of an isolation structure which adjoins an active region is etched away so that the active region can protrude. As a result of this design a fin pattern is formed such that the front and rear surfaces and the upper surface of the active region are exposed. By forming a gate line that covers the fin pattern, the short channel effect can be suppressed. Because a channel is formed through the three exposed surfaces of the active region, current drivability through the channel can be significantly improved.

However, in the conventional art, as the cell size of a semiconductor device is reduced, the width of a fin pattern decreases. As a result the controllability of a gate deteriorates and drain-induced barrier lowering (DIBL) and swing properties are degraded. Whereupon the characteristics of the transistor become poor.

SUMMARY OF THE INVENTION

Embodiments of the present invention are directed to a semiconductor device which can improve the characteristics of transistors and a method for manufacturing the same.

In one aspect of the present invention, a semiconductor device comprises a semiconductor substrate defined with first grooves in gate forming areas; an isolation structure formed in the semiconductor substrate and defined with second grooves which expose front and rear surfaces of the gate forming areas having the first grooves defined therein; and gates formed within the first grooves of the gate forming areas and formed within the second grooves of the isolation structure, to cover the exposed front and rear surfaces of the gate forming areas, wherein lower portions of the second grooves are wider than respective upper portions of the second grooves.

The first grooves have a depth of about 1,000~2,500 Å.

The second grooves are deeper than the first grooves.

The front and rear surfaces of the gate forming areas are exposed by a height of about 100~1,000 Å due to defining of the second grooves.

The front and rear surfaces of the gate forming areas are exposed by a width of about 100~1,000 Å due to defining of the second grooves.

The semiconductor device further comprises an impurity ion implantation layer formed in lower portions of the isolation structure which adjoin the exposed front and rear surfaces of the gate forming areas.

In another aspect of the present invention, a method for manufacturing a semiconductor device comprises the steps of forming an isolation structure in a semiconductor substrate; defining first grooves by etching into gate forming areas of the semiconductor substrate and defining second grooves by etching into the isolation structure to expose front and rear surfaces of the gate forming areas; and forming gates within the first grooves in the gate forming areas and forminf gates within the second grooves in portions of the isolation structure to cover the exposed front and rear surfaces of the gate forming areas, wherein the second grooves expose the front and rear surfaces of the gate forming areas and lower portions of the swcond grooves are wider than respective upper portions of the second grooves.

The first grooves are defined to have a depth of about 1,000~2,500 Å.

The second grooves are deeper than the first grooves.

The front and rear surfaces of the gate forming areas are exposed by a height of about 100~1,000 Å due to defining of the second grooves.

The front and rear surfaces of the gate forming areas are exposed by a width of about 100~1,000 Å due to defining of the second grooves.

In still another aspect of the present invention, a method for manufacturing a semiconductor device comprises the steps of forming an isolation structure in a semiconductor substrate to delimit active regions; forming an impurity ion implantation layer in portions of the isolation structure that adjoin the active regions; defining first grooves into the active regions by etching into the semiconductor substrate and defining second grooves by etching into the isolation structure so that front and rear surfaces of the active regions are exposed and lower portions of the second grooves are placed in the impurity ion implantation layer; selectively etching portions of the isolation structure which delimit the lower portions of the second grooves so that the lower portions of the second grooves which expose the front and rear surfaces of the areas active regions and the lower portions of the second grooves are wider than respective upper portions of the second grooves; and forming gates within the first grooves in the active regions and forming gates within the second grooves in portions of the isolation structure that extend from the active regions to cover the exposed front and rear surfaces of the gate forming areas.

The impurity ion implantation layer is formed by using an impurity ion implantation process using at least one of As, P, B, $BF_2$ and F as ion dopants.

The impurity ion implantation process is conducted by setting a target ion implantation depth to about 300~2,000 Å.

The step of forming the impurity ion implantation layer comprises the steps of forming line type mask patterns on the semiconductor substrate which is formed with the isolation structure, in such a way as to expose portions of the isolation structure between the active regions and extend along a major axis direction of the active regions; conducting an impurity ion implantation process for the portions of the isolation structure which are exposed between the mask patterns; and removing the mask patterns.

The step of forming the impurity ion implantation layer comprises the steps of forming a mask pattern on the semiconductor substrate which is formed with the isolation structure to expose the active regions and portions of the isolation structure which adjoin the active regions along a minor axis direction of the active regions; conducting an impurity ion implantation process for the portions of the isolation structure which are exposed through the mask pattern; and removing the mask pattern.

The step of forming the impurity ion implantation layer comprises the steps of forming a mask pattern on the semiconductor substrate which is formed with the isolation structure and which exposes portions of the isolation structure which adjoin the active regions along a minor axis direction of the active regions; conducting an impurity ion implantation process for the portions of the isolation structure which are exposed through the mask pattern; and removing the mask pattern.

The impurity ion implantation process is conducted in a direction perpendicular to a surface of the semiconductor substrate.

The first grooves are defined to have a depth of about 1,000~2,500 Å.

The second grooves are defined to have a depth greater than that of the first grooves.

The front and rear surfaces of the gate forming areas are exposed by a height of about 100~1,000 Å due to defining of the second grooves.

The front and rear surfaces of the gate forming areas are exposed by a width of about 100~1,000 Å due to defining of the second grooves.

The step of selectively etching the portions of the isolation structure that delimits the lower portions of the second grooves is performed by either a wet or dry cleaning type.

In a still further aspect of the present invention, a method for manufacturing a semiconductor device comprises the steps of forming an isolation structure in a semiconductor substrate to delimit active regions; defining first grooves in the active regions by etching into the active regions of the semiconductor substrate and defining second grooves by etching into the isolation structure to expose front and rear surfaces of the active regions; forming an impurity ion implantation layer in portions of the isolation structure which adjoin the exposed front and rear surfaces of the areas active regions and delimit lower portions of the second grooves; selectively etching portions of the isolation structure which delimit the lower portions of the second grooves so that the lower portions of the second grooves expose the front and rear surfaces of the active regions and the lower portions of the second grooves are wider than respective upper portions of the second grooves; and forming gates within the first grooves in the active regions and forming gates within the second grooves in portions of the isolation structure which extend from the active regions to cover the exposed is front and rear surfaces of the active regions.

The impurity ion implantation layer is formed using an impurity ion implantation process that incorporates at least one of As, P, B, $BF_2$ and F as impurities.

The impurity ion implantation process is conducted by setting a target ion implantation depth to about 300~2,000 Å.

The step of forming the impurity ion implantation layer comprises the steps of forming a mask pattern on the semiconductor substrate which is defined with the first and second grooves, in such a way as to expose the active regions and portions of the isolation structure which adjoin the active regions along a minor axis direction of the active regions; conducting an impurity ion implantation process for the portions of the isolation structure which are exposed through the mask pattern; and removing the mask pattern.

The step of forming the impurity ion implantation layer comprises the steps of forming line type mask patterns on the semiconductor substrate which is defined with the first and second grooves, in such a way as to expose the first and second grooves and extend along a minor axis direction of the active regions; conducting an impurity ion implantation process for portions of the isolation structure which are exposed between the mask patterns; and removing the mask pattern.

The step of forming the impurity ion implantation layer comprises the steps of forming a mask pattern on the semiconductor substrate which is defined with the first and second grooves, in such a way as to expose the second grooves defined in portions of the isolation structure adjoining the active regions along a minor axis direction of the active regions and other portions of the isolation structure between the second grooves; conducting an impurity ion implantation process for the portions of the isolation structure which are exposed through the mask pattern; and removing the mask pattern.

The step of forming the impurity ion implantation layer comprises the steps of forming a mask pattern on the semiconductor substrate which is defined with the first and second grooves, in such a way as to expose the second grooves defined in portions of the isolation structure adjoining the active regions along a minor axis direction of the active regions; conducting an impurity ion implantation process for the portions of the isolation structure which are exposed through the mask pattern; and removing the mask pattern.

The impurity ion implantation process is conducted in a direction tilted about 2-45 degrees away from perpendicular with respect to a surface of the semiconductor substrate.

The first grooves are defined to have a depth of about 1,000~2,500 Å.

The second grooves are deeper than the first grooves.

The front and rear surfaces of the gate forming areas are exposed by a height of about 100~1,000 Å due to defining of the second grooves.

The front and rear surfaces of the gate forming areas are exposed by a width of about 100~1,000 Å due to defining of the second grooves.

The step of selectively etching the portions of the isolation structure which delimit the lower portions of the second grooves is performed by either a wet or dry cleaning type.

DESCRIPTION OF SPECIFIC EMBODIMENTS

Hereafter, specific embodiments of the present invention will be described in detail with reference to the accompanying drawings.

Figure 1:
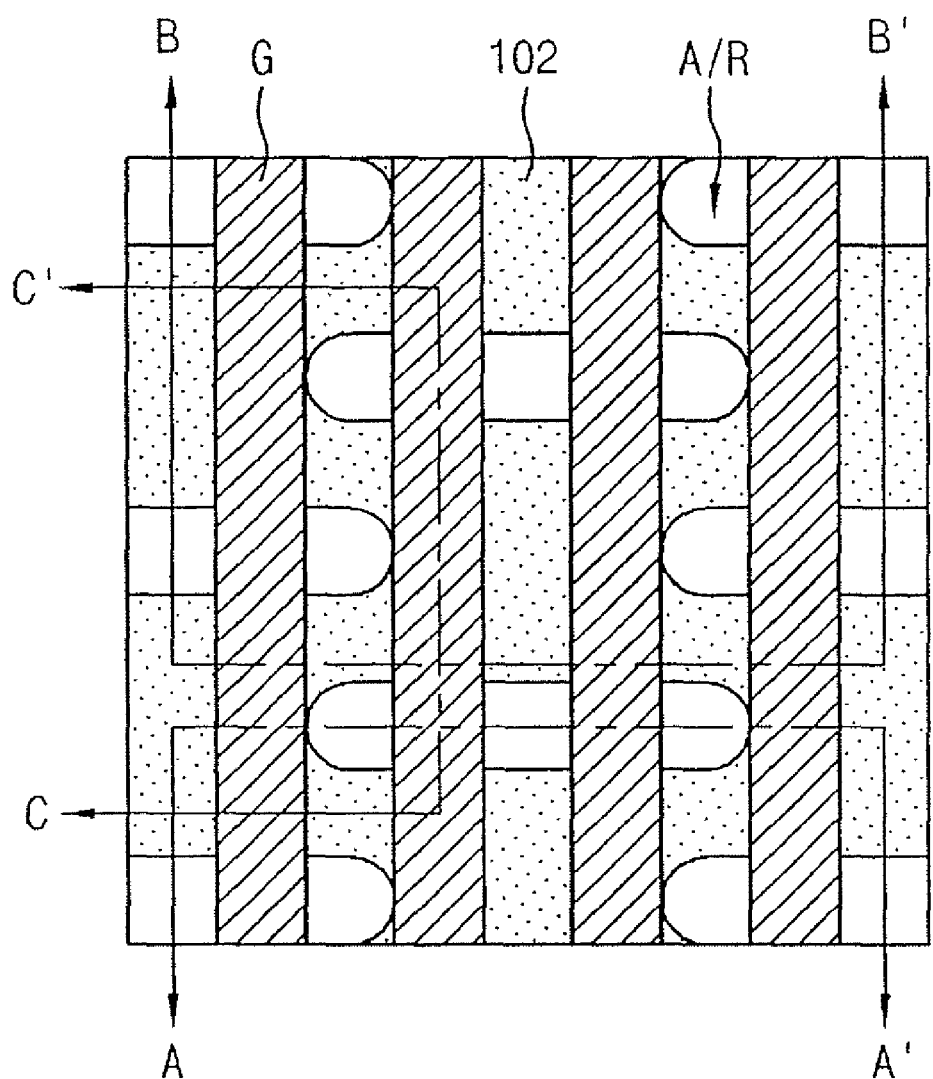
FIG. 1 is a plan view illustrating a semiconductor device.
Figure 2A:
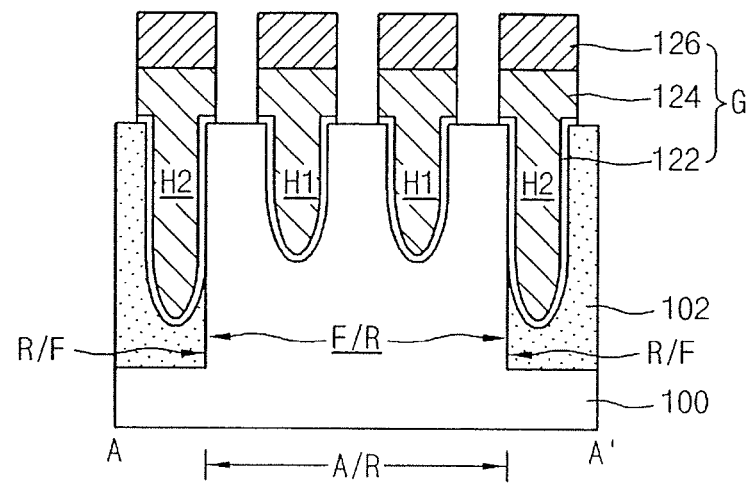
FIGS. 2A through 2C are sectional views respectively taken along the lines A-A' (major axis), B-B' and C-C' (minor axis) of FIG. 1, illustrating a semiconductor device in accordance with a first embodiment of the present invention.
Figure 2B:
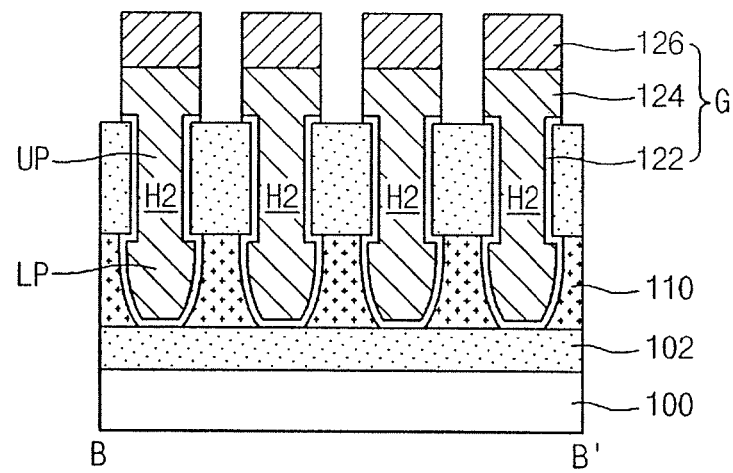
Figure 2C:
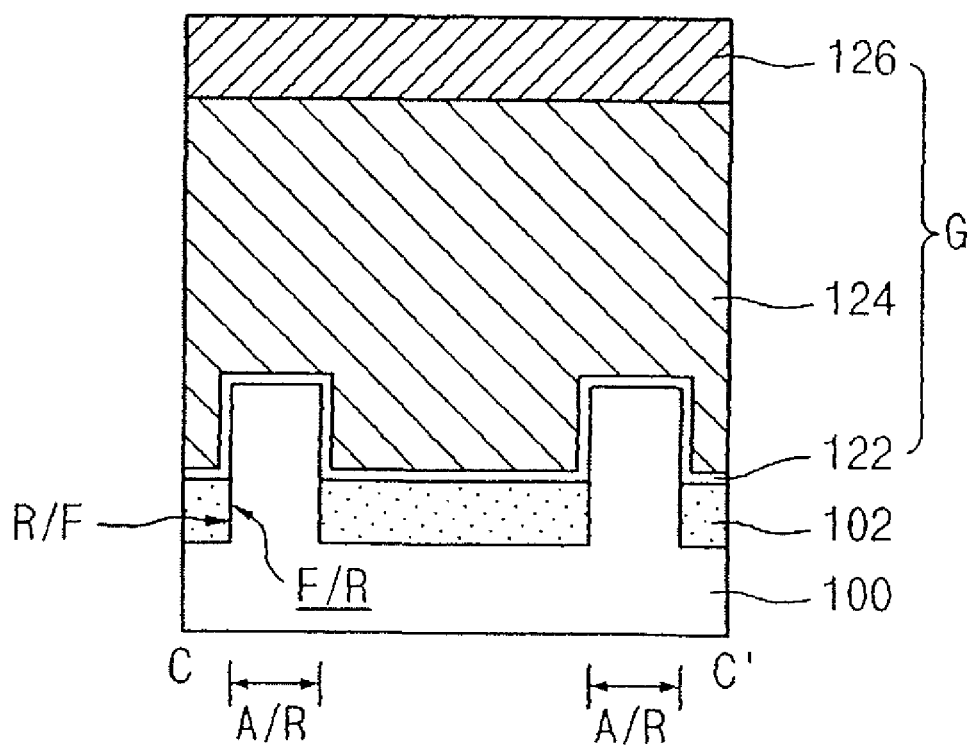

FIG. 1 is a plan view illustrating a semiconductor device, and FIGS. 2A through 2C are sectional views respectively taken along the lines A-A', B-B' and C-C' of FIG. 1, illustrating a semiconductor device in accordance with a first embodiment of the present invention.

Referring to FIG. 2A, an isolation structure 102 is formed in a semiconductor substrate 100 that delimits an active region A/R. First grooves H1 are defined in gate forming areas of the active region A/R on the semiconductor substrate 100.

Second grooves H2 are defined in the isolation structure 102 that expose the front and rear surfaces F&R of the gate forming areas of the active region A/R in which the first grooves H1 are defined.

The first grooves H1 defined in the active region A/R have a depth corresponding to about 1,000~2,500 Å, and the second grooves H2 defined in the isolation structure 102 have a depth that is greater than the depth of the first grooves H1, for example, by about 100~1,000 Å, such that the front and rear surfaces F/R of the gate forming areas can be exposed. Thus, referring to FIGS. 2A and 2C, the front and rear surfaces F/R of the gate forming areas are exposed by the second grooves H2 at a depth of the portions of the second grooves H2 which extend downward from the bottoms of the first grooves H1, that is, about 100~1,000 Å, and at a width of about 100~1,000 Å. Also shown is the rear and front surfaces R/F of the isolation structure 102.

Referring to FIG. 2B, an impurity ion implantation layer 110 is formed in portions of the isolation structure 102 that adjoin the exposed front and rear surfaces of the gate forming areas. The second grooves H2 of the isolation structure 102 are defined by the lower portions LP of the second grooves H2, which expose the front and rear surfaces of the gate forming areas, and which have a width greater than the upper portions UP of the second grooves H2.

Referring to FIGS. 2A through 2C, saddle fin gates G are formed in the gate forming areas of the active region A/R in which the first grooves H1 are defined and in the portions of the isolation structure 102 in which the second grooves H2 cover the exposed surfaces of the gate forming areas. The saddle fin gates G include a gate insulation layer 122, a gate conductive layer 124 and a gate hard mask layer 126.

In the present invention, due to the fact that the lower portions of grooves defined in portions of an isolation structure, which adjoin the active region A/R, expose the front and rear surfaces of gate forming areas in the active region have a width greater than the upper portions of the grooves, the width of a saddle fin pattern in the lengthwise direction of a channel can be increased. By doing this the controllability of gates can be enhanced and the DIBL and swing properties can be upgraded, whereupon the transistor characteristics can be improved.

FIGS. 3A through 3E and 4A through 4C are sectional views taken in correspondence to the lines A-A' and B-B' of FIG. 1, illustrating the processes of a method for manufacturing a semiconductor device in accordance with a second embodiment of the present invention.

Figure 3A:
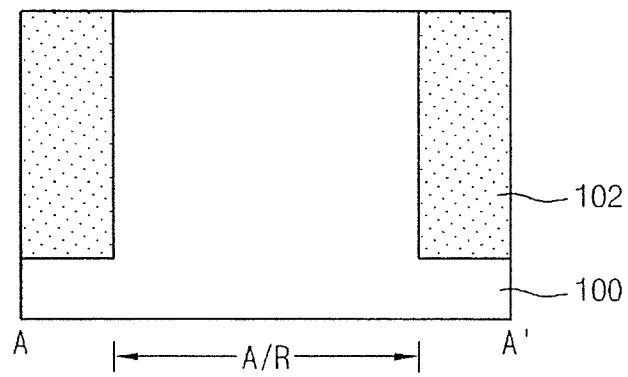
FIGS. 3A through 3E are sectional views taken in correspondence to the line A-A' of FIG. 1, illustrating the processes of a method for manufacturing a semiconductor device in accordance with a second embodiment of the present invention.
Figure 4A:
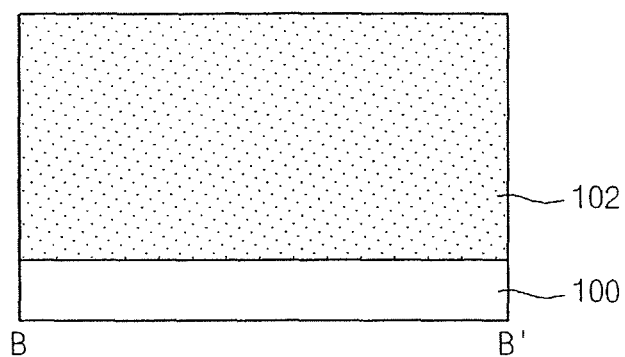
FIGS. 4A through 4E are sectional views taken in correspondence to the line B-B' of FIG. 1, illustrating the processes of the method for manufacturing a semiconductor device in accordance with the second embodiment of the present invention.

Referring to FIGS. 3A and 4A, an isolation structure 102 is formed in a semiconductor substrate 100 in such a way as to delimit an active region A/R. Meanwhile, before or after forming the isolation structure 102, an ion implantation process for forming a well can be conducted for the semiconductor substrate 100.

Figure 3B:
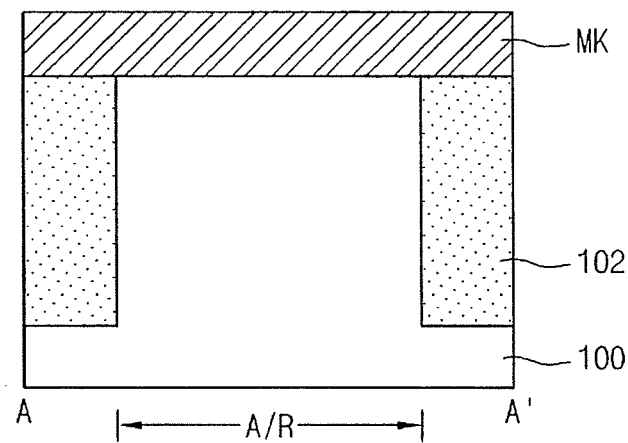
Figure 4B:
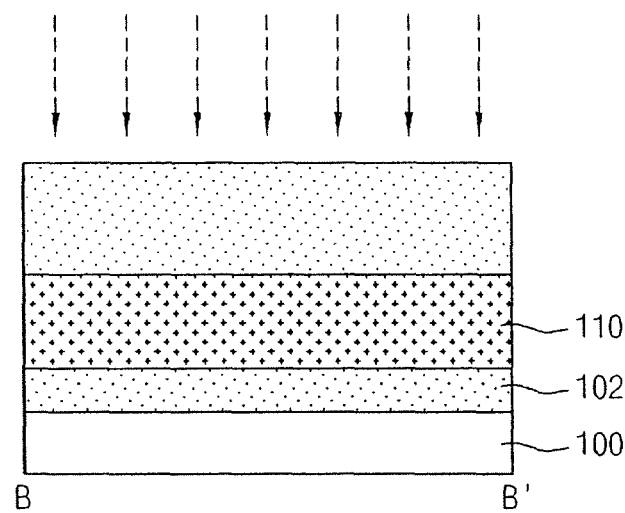

Referring to FIGS. 3B and 4B, an impurity ion implantation layer 110 is formed in portions of the isolation structure 102 that adjoins the active region A/R. The impurity ion implantation layer 110 is formed by implanting at least one of As, P, B, $BF_2$ and F impurity ions. The impurity ion implantation process is conducted in a direction substantially perpendicular to the surface of the semiconductor substrate 100 by setting a target ion implantation depth to about 300~2,000 Å.

Figure 5:
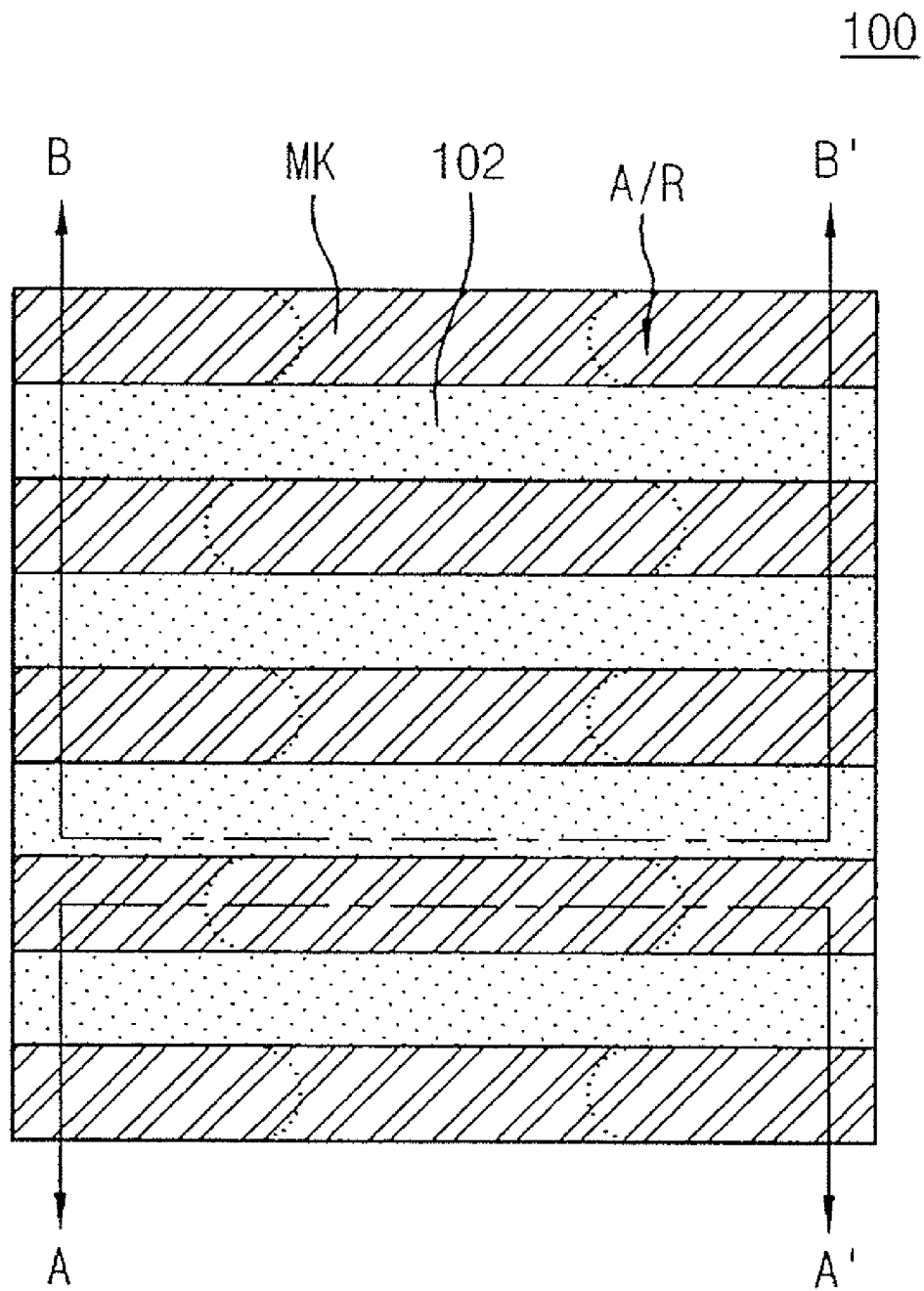
FIG. 5 is a plan view illustrating line type mask patterns which expose portions of an isolation structure between active regions and extend along the major axis direction of the active regions.

Afterwards line type mask patterns MK are then formed, as shown in FIG. 5, on the semiconductor substrate 100 and are formed with the isolation structure 102 to expose portions of the isolation structure 102 between active regions A/R and extend along the major axis direction of the active regions A/R. Accordingly, the impurity ion implantation process is conducted on the portions of the isolation structure that are exposed between the mask patterns MK.

Figure 3C:
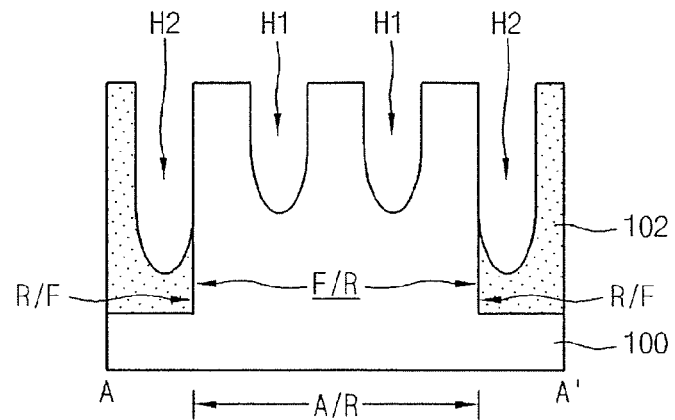
Figure 4C:
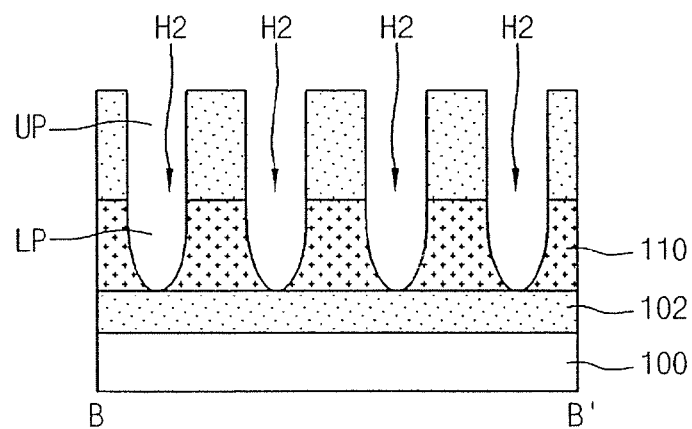

Referring to FIGS. 3C and 4C, after removing the mask patterns MK, by etching the active region A/R of the semiconductor substrate 100, first grooves H1 are defined in gate forming areas. By etching the isolation structure 102 formed with the impurity ion implantation layer 110, second grooves H2 are defined such that the front and rear surfaces of the gate forming areas of the active region A/R, in which the first grooves H1 are defined, are exposed and the lower portions of the second grooves H2 are defined in the impurity ion implantation layer 110. The first grooves H1 can be defined first by first etching the active region A/R, or the second grooves H2 can be defined first by first etching the isolation structure 102.

The first grooves H1 of the active region A/R are defined to have a depth of about 1,000~2,500 Å. The second grooves H2 of the isolation structure 102 are defined to have a depth that is greater than the depth of the first grooves H1, for example, by about 100~1,000 Å, such that the front and rear surfaces of the gate forming areas can be exposed. Thus, the front and rear surfaces of the gate forming areas are exposed due to defining of lo the second grooves H2 by a depth of the portions of the second grooves H2 which extend downward from the bottoms of the first grooves H1, that is, about 100~1,000 Å, and by a width of about 100~1,000 Å.

Figure 3D:
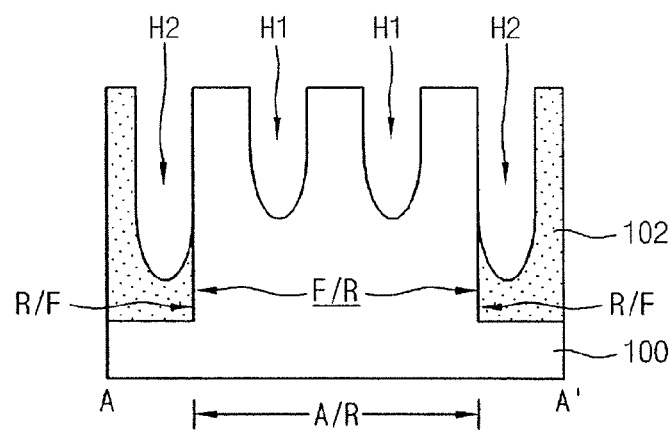
Figure 4D:
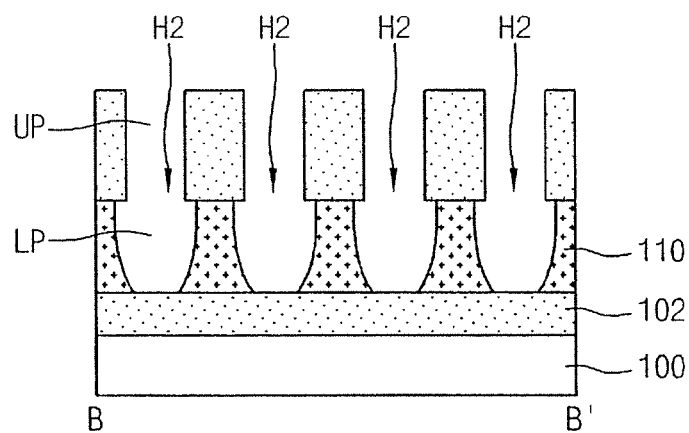

Referring now to FIGS. 3D and 4D, a pre-cleaning process is then conducted on the resultant semiconductor substrate 100 defined with the first and second grooves H1 and H2 before a gate insulation layer is formed. The pre-cleaning process can be conducted by either a dry type or a wet type process. By conducting the pre-cleaning process, portions of the isolation structure 102, that delimit the lower portions of the second grooves H2 defined in the impurity ion implantation layer 110, are selectively etched. As a result, the lower portions of the second grooves H2, which expose the front and rear surfaces of the gate forming areas, have a width greater than the upper portions of the second grooves H2.

Figure 3E:
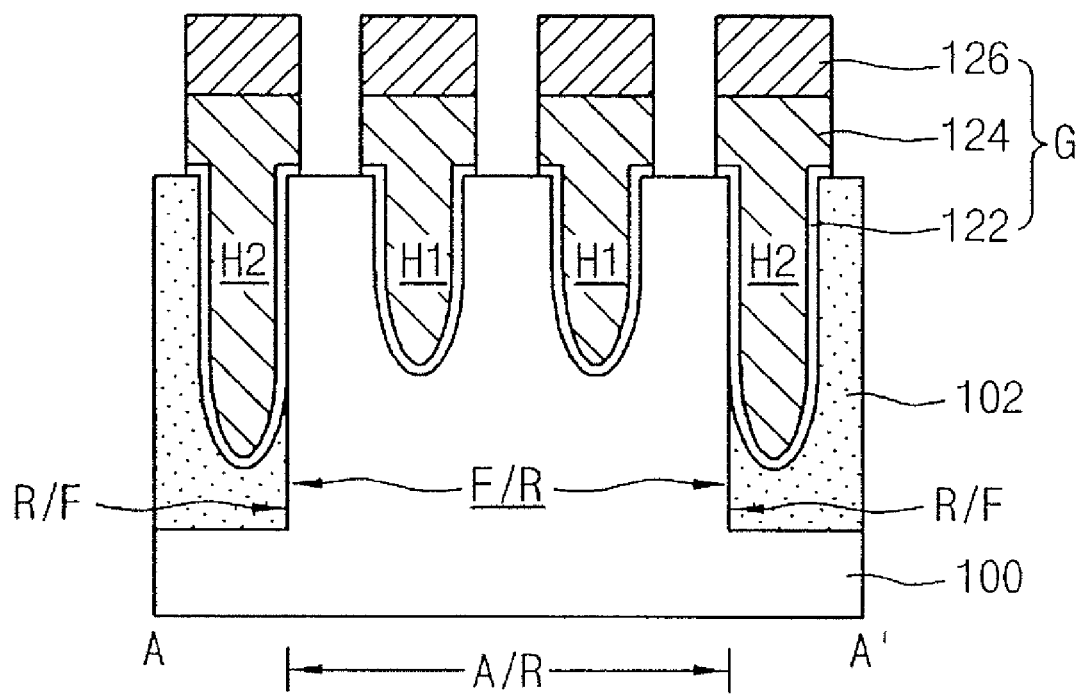
Figure 4E:
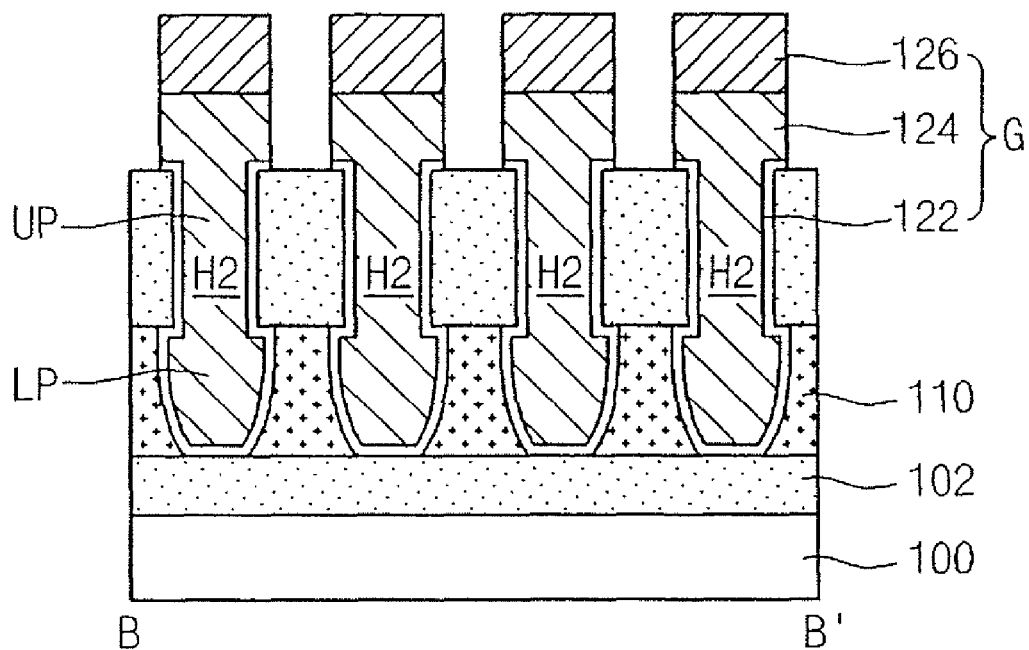

Referring to FIGS. 3E and 4E, saddle fin gates G are formed in the gate forming areas of the active region A/R in which the first grooves H1 are defined and in the portions of the isolation structure 102 in which the second grooves H2 are defined. The saddle fin gates G are formed to cover the exposed surfaces of the gate forming areas. The saddle fin gates G include a gate insulation layer 122, a gate conductive layer 124 and a gate hard mask layer 126. The gate insulation layer 122 is formed as an oxide layer through, for example, by either a dry oxidation process or a radical oxidation process. The gate conductive layer 124 may be composed of a doped polysilicon layer.

Thereafter, while not shown in a drawing, a source region and a drain region are formed in the active region on both sides of each saddle fin gate. Then, by sequentially conducting a series of well-known subsequent processes, the manufacture of a semiconductor device according to the embodiment of the present invention is completed.

As is apparent from the above description, in the present embodiment, by further etching second grooves which are defined in portions of an isolation structure adjoining an active region in such a way as to be increased in width, the width of the front and rear surfaces of gate forming areas of the active region, which are exposed through the second grooves, can be increased in the lengthwise direction of a channel. Through this, as the width of a saddle fin pattern is increased in the lengthwise direction of the channel, in the present invention, the controllability of gates can be enhanced, and the DIBL and swing properties can be improved, whereupon the resultant transistor characteristics can be improved.

Also, in the present invention, by forming an impurity ion implantation layer in portions of the isolation structure which delimit the lower portions of the second grooves, only the portions of the isolation structure in which the impurity ion implantation layer is formed can be selectively etched. As a result, the width of the lower portions of the second grooves can be increased as compared to the upper portions of the second grooves. Therefore, in the present invention, it is possible to effectively increase the width of the saddle fin pattern while preventing the occurrence an SAC (self-aligned contact) failure of a landing plug and a bridge phenomenon between gates that can otherwise be caused when the width of the second grooves defined in the portions of the isolation structure is overall increased.

While it was described in the above embodiment that the impurity ion implantation layer is formed by an impurity ion implantation process using the line type mask patterns that expose portions of the isolation structure between the active regions and that extend along the major axis direction of the active regions, it is therefore understood that other embodiments of the present invention envision that an impurity ion implantation layer can be formed through an impurity ion implantation process using various shapes of mask patterns.

Figure 6:
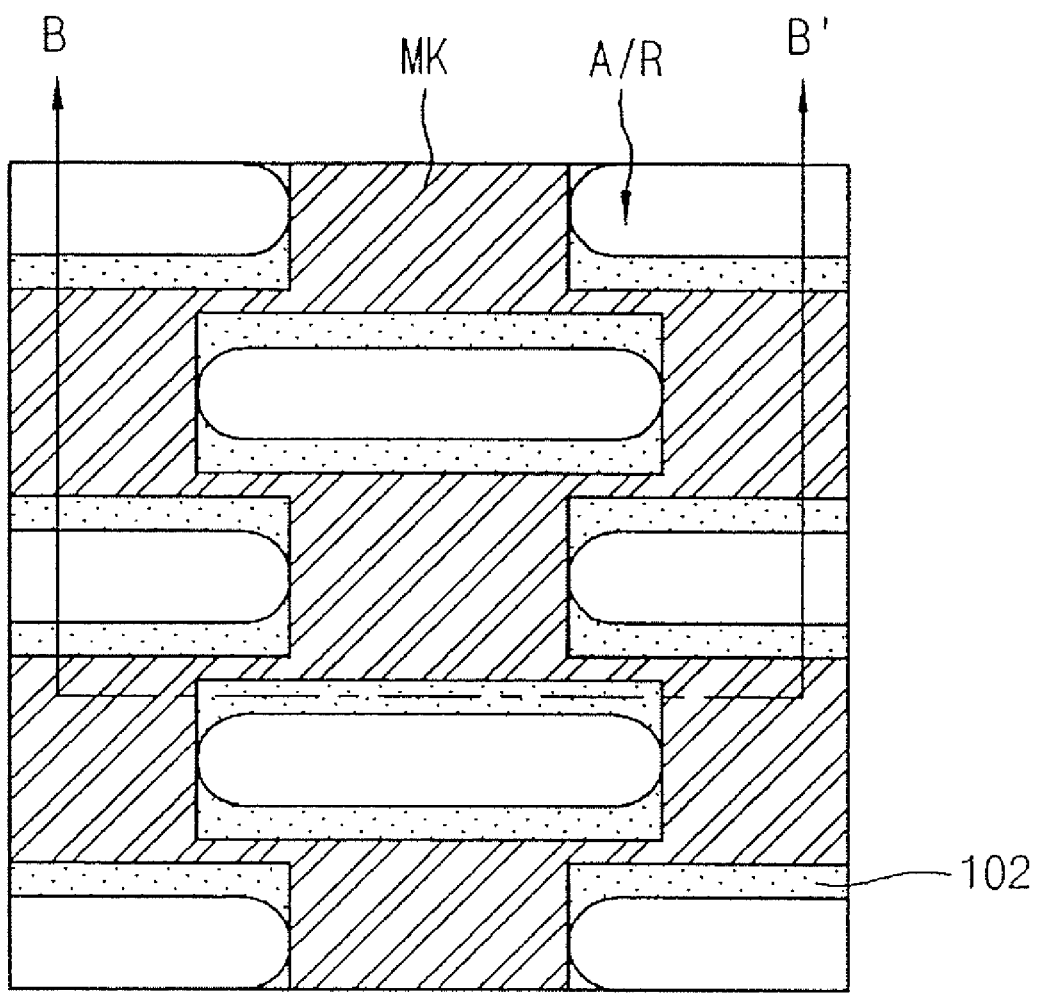
FIG. 6 is a plan view illustrating a mask pattern which exposes active regions and portions of an isolation structure adjoining the active regions along the minor axis direction of the active regions.
Figure 7A:
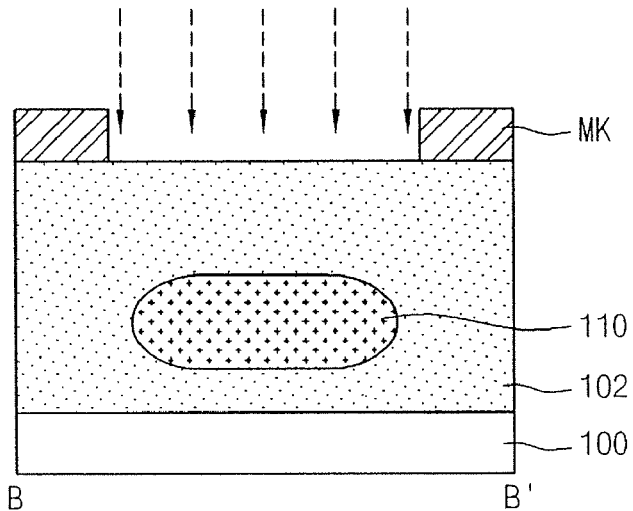
FIGS. 7A through 7C are sectional views taken in correspondence to the line B-B' of FIG. 6, illustrating the processes of a method for manufacturing a semiconductor device in accordance with a third embodiment of the present invention.
Figure 7B:
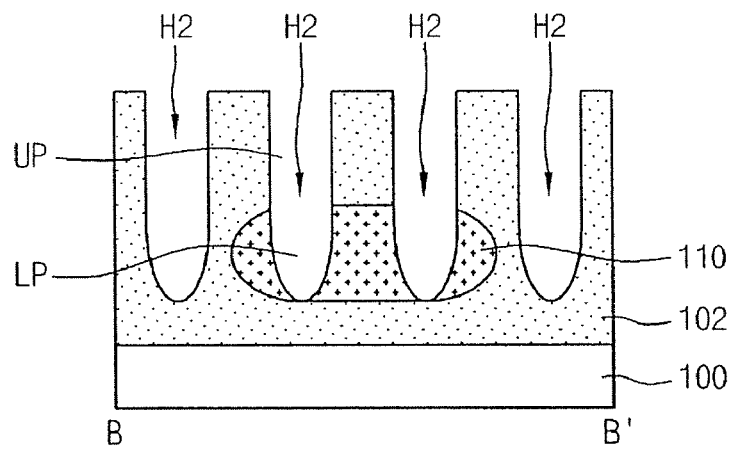
Figure 7C:
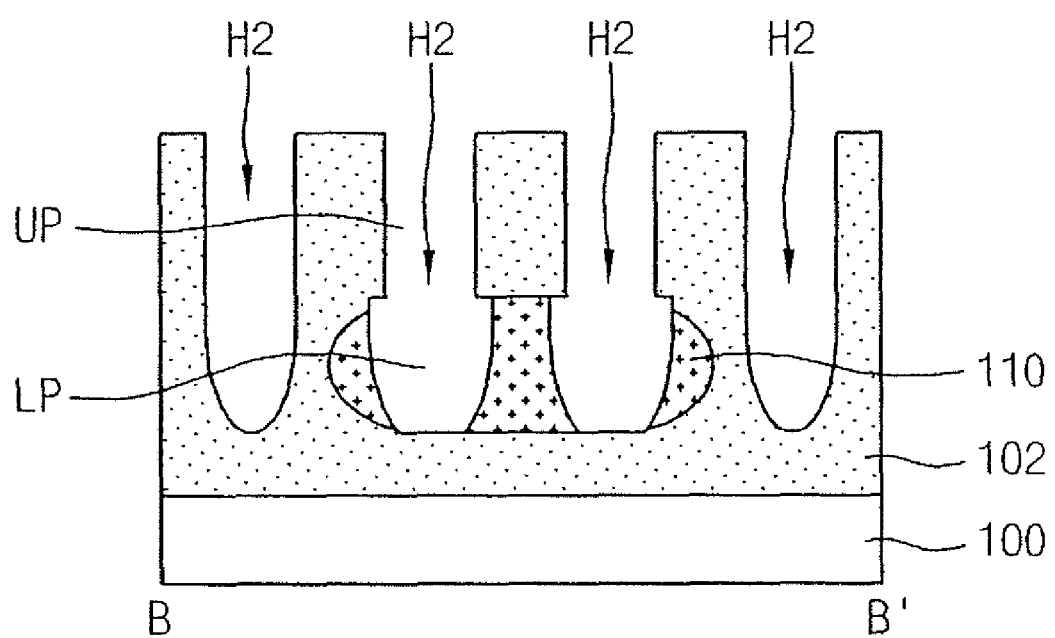

FIG. 6 is a plan view illustrating a mask pattern which exposes active regions and portions of an isolation structure adjoining the active regions along the minor axis direction of the active regions, and FIGS. 7A through 7C are sectional views taken in correspondence to the line B-B' of FIG. 6, illustrating the processes of a method for manufacturing a semiconductor device in accordance with a third embodiment of the present invention.

Referring to FIG. 7A, a mask pattern MK of FIG. 6 is formed on a semiconductor substrate 100 that is formed with an isolation structure 102 that exposes active regions and portions of the isolation structure 102 that adjoin the active regions along the minor axis direction, i.e., the width, of the active regions. By implanting impurities in exposed portions of the isolation structure 102, i.e., exposed through the mask pattern MK, an impurity ion implantation layer 110 is formed. Impurities, such as As, P, B, $BF_2$ and F, are ion implanted along a direction substantially perpendicular to the planar surface of the semiconductor substrate 100 and the target ion implantation depth is set to about 300~2,000 Å.

Referring to FIG. 7B, after removing the mask pattern MK, by etching gate forming areas of the active region, first grooves are defined, and by etching the portions of the isolation structure 102, second grooves H2 are defined. The second grooves H2 are defined such that the lower portions of the second grooves H2 are placed in the impurity ion implantation layer 110.

Referring to FIG. 7C, a pre-cleaning process is conducted on the resultant semiconductor substrate 100 which is defined with the first grooves and the second grooves H2. By conducting the pre-cleaning process, portions of the isolation structure 102, which delimit the lower portions of the second grooves H2 placed in the impurity ion implantation layer 110, are selectively etched. As a result, the lower portions of the second grooves H2, that expose the front and rear surfaces of the gate forming areas, result in having a width greater than the upper portions of the second grooves H2.

Thereafter, while not shown in a drawing, after forming saddle fin gates in and over the first and second grooves and forming a source region and a drain region in the active region on both sides of each saddle fin gate, by sequentially conducting a series of well-known subsequent processes, the manufacture of a semiconductor device in accordance with the embodiment of the present invention is completed.

Figure 8:
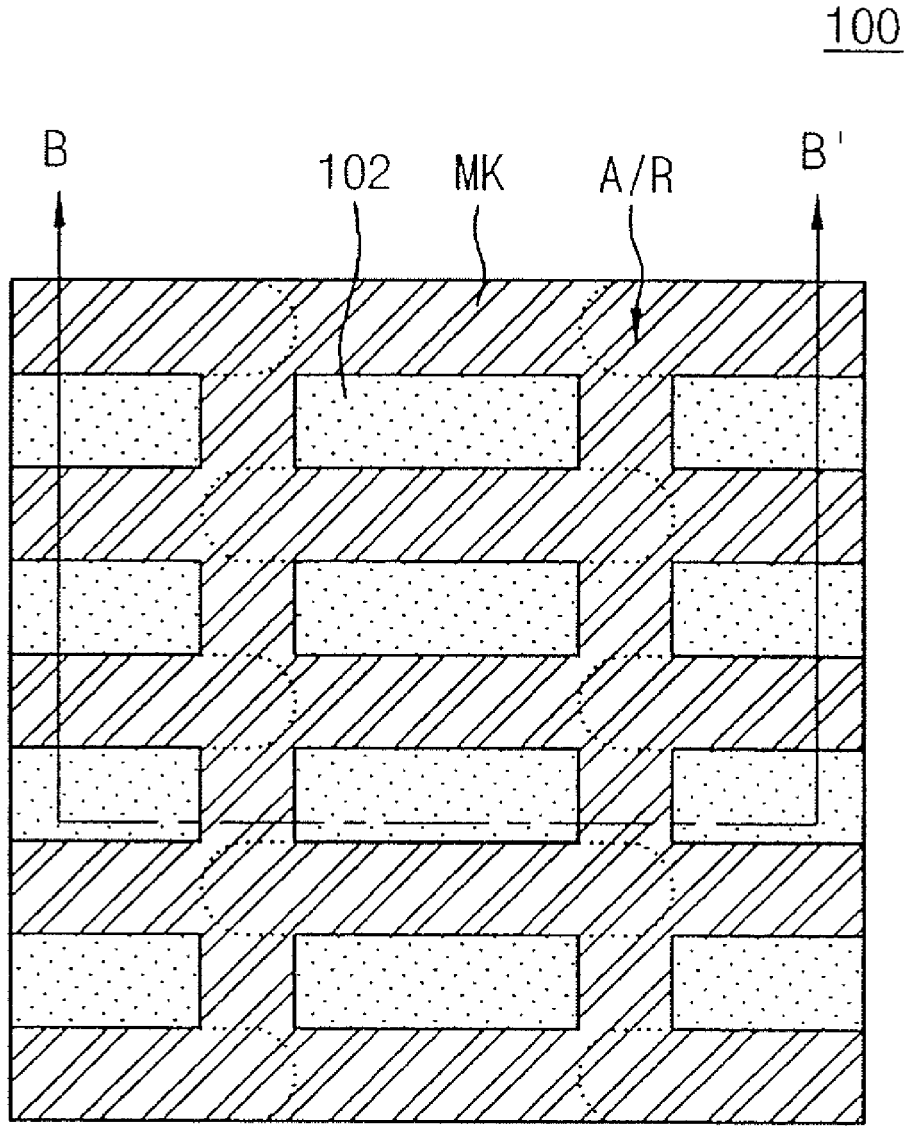
FIG. 8 is a plan view illustrating a mask pattern which exposes portions of an isolation structure adjoining active regions along the minor axis direction of the active regions.
Figure 9A:
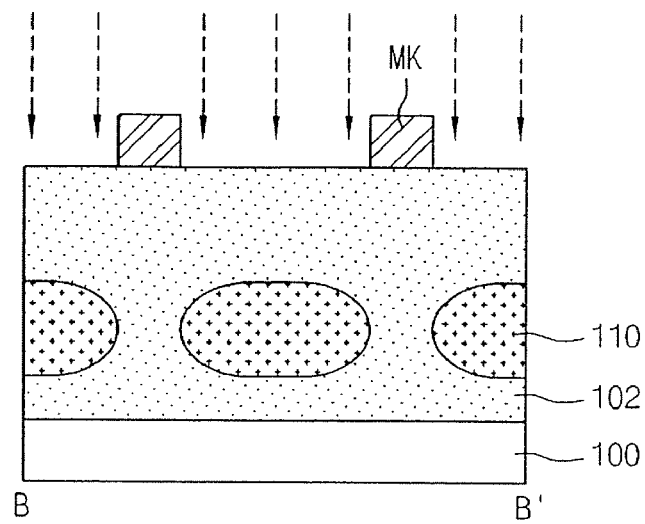
FIGS. 9A through 9C are sectional views taken in correspondence to the line B-B' of FIG. 8, illustrating the processes of a method for manufacturing a semiconductor device in accordance with a fourth embodiment of the present invention.
Figure 9B:
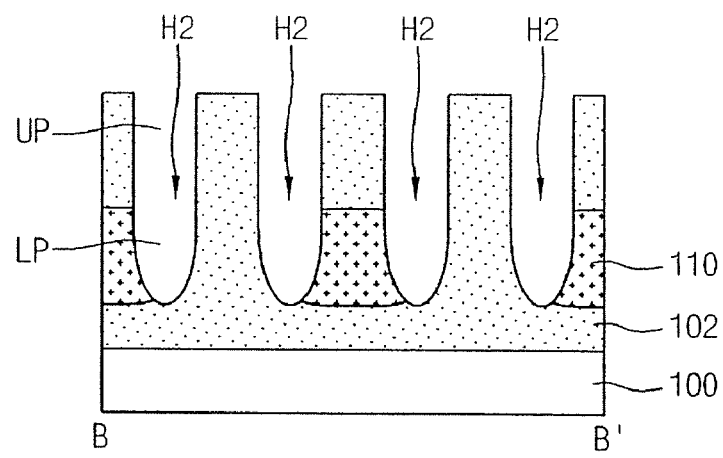
Figure 9C:
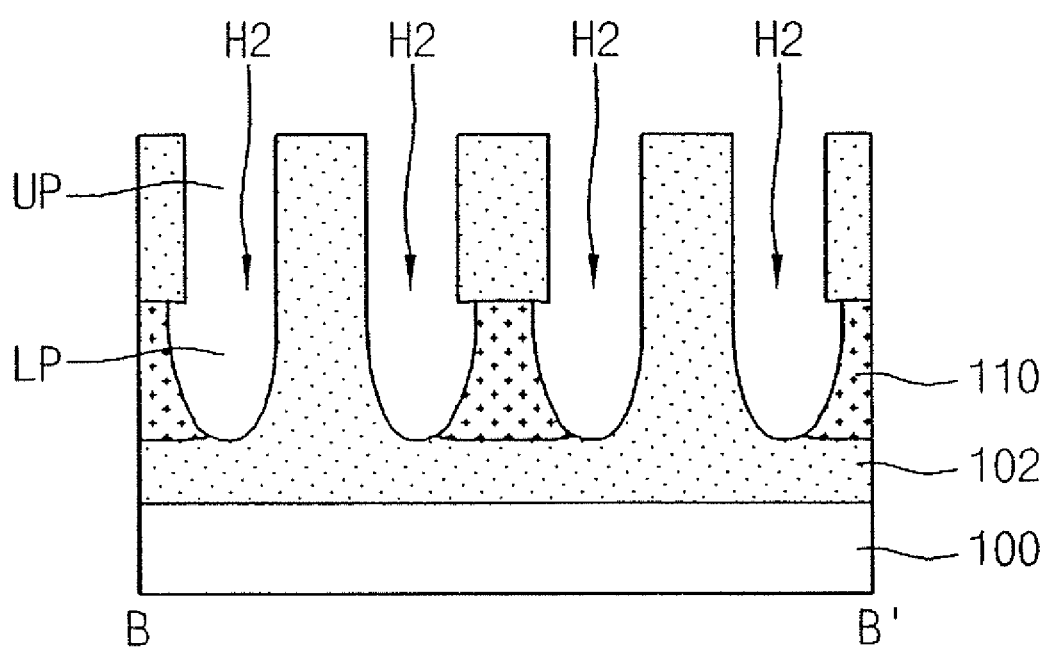

FIG. 8 is a plan view illustrating a mask pattern which exposes portions of an isolation structure adjoining active regions along the minor axis direction of the active regions, and FIGS. 9A through 9C are sectional views taken in correspondence to the line B-B' of FIG. 8, illustrating the processes of a method for manufacturing a semiconductor device in accordance with a fourth embodiment of the present invention.

Referring to FIG. 9A, a mask pattern MK of FIG. 8 is formed on a semiconductor substrate 100 which is formed with an isolation structure 102, that exposes portions of the isolation structure 102 which adjoin an active region along the minor axis direction of the active region. Then, by implanting impurity ions into portions of the isolation structure 102 exposed through the mask pattern MK, an impurity ion implantation layer 110 is formed. The impurity ions, such as As, P, B, $BF_2$ and F are implanted in a direction substantially perpendicular to the surface of the semiconductor substrate 100 and their respective target ion implantation depth is set to about 300~2,000 Å.

Referring to FIG. 9B, after removing the mask pattern MK, by etching gate forming areas of the active region, first grooves are defined, and by etching the portions of the isolation structure 102, second grooves H2 are defined. The second grooves H2 are defined such that the lower portions of the second grooves H2 are placed in the impurity ion implantation layer 110.

Referring to FIG. 9C, a pre-cleaning process is conducted on the resultant semiconductor substrate 100 which is defined with the first grooves and the second grooves H2. By conducting the pre-cleaning process, portions of the isolation structure 102, which delimit the lower portions of the second grooves H2 placed in the impurity ion implantation layer 110, are then selectively etched. As a result, the lower portions of the second grooves H2, which expose the front and rear surfaces of the gate forming areas, result in having widths greater than their respective upper portions of the second grooves H2.

Thereafter, while not shown in a drawing, after forming saddle fin gates in and over the first and second grooves and forming a source region and a drain region in the active region on both sides of each saddle fin gate, by sequentially conducting a series of well-known subsequent processes, the manufacture of a semiconductor device in accordance with the embodiment of the present invention is completed.

In the above-mentioned embodiments, after an impurity ion implantation layer is first formed by implanting impurity ions in a direction substantially perpendicular to the planar surface of a semiconductor substrate, first and second grooves are then defined. However, in other embodiments of the present invention, it is understood that, after first and second grooves are first defined, an impurity ion implantation layer can be subsequently formed by implanting ion impurities in a direction tilted with respect to the surface of a semiconductor substrate by using various shapes of mask patterns.

Figure 10A:
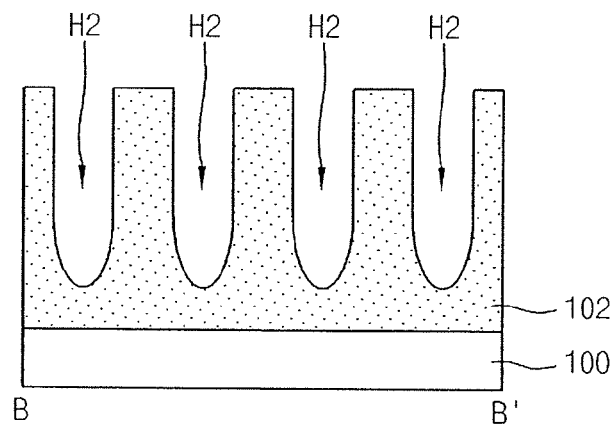
FIGS. 10A through 10C are sectional views taken in correspondence to the line B-B' of FIG. 6, illustrating the processes of a method for manufacturing a semiconductor device in accordance with a fifth embodiment of the present invention.
Figure 10B:
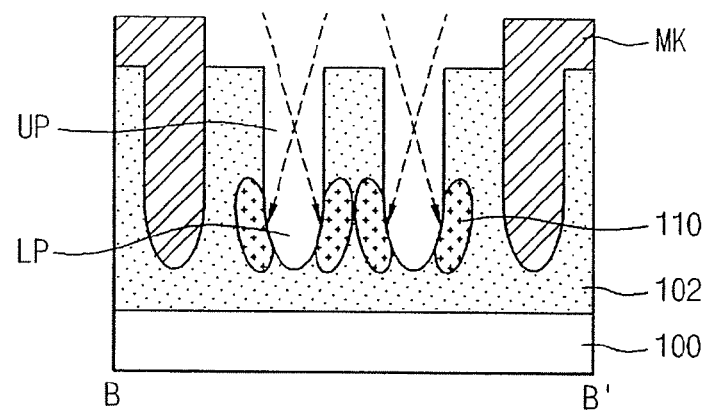
Figure 10C:
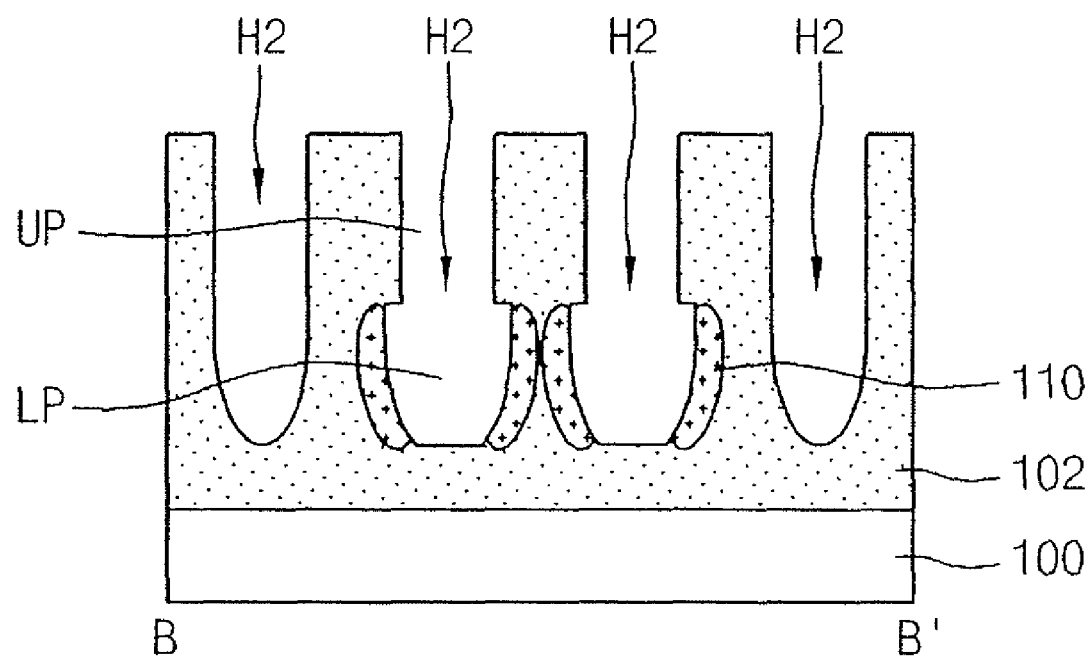

FIGS. 10A through 10C are sectional views taken in correspondence to the line B-B' of FIG. 6, illustrating the processes of a method for manufacturing a semiconductor device in accordance with a fifth embodiment of the present invention.

Referring to FIG. 10A, first grooves are defined by etching gate forming areas of the active region and second grooves H2 are defined by etching portions of the isolation structure 102.

Referring to FIG. 10B, a mask pattern MK of FIG. 6 is formed on a semiconductor substrate 100 which is defined with the first grooves and the second grooves H2, that exposes active regions and portions of the isolation structure 102 that adjoin the active regions along the minor axis direction of the active regions. Then, an impurity ion implantation layer 110 is formed by conducting an impurity ion implantation process at portions of the isolation structure 102 exposed through the mask pattern MK.

Impurities such as As, P, B, $BF_2$ and F are ion implanted in a direction tilted with respect to the planar surface of the semiconductor substrate 100. Also, the target ion implantation depth is set to about 300~2,000 Å so that the impurity ion implantation layer 110 is placed in the lower portions of the second grooves H2.

Referring to FIG. 10C, after removing the mask pattern MK, a pre-cleaning process is conducted for the resultant semiconductor substrate 100 which is formed with the impurity ion implantation layer 110. By conducting the pre-cleaning process, portions of the isolation structure 102, which delimit the lower portions of the second grooves H2 placed in the impurity ion implantation layer 110, are selectively etched. As a result, the lower portions of the second grooves H2, which expose the front and rear surfaces of the gate forming areas, results in having a width greater than their respective upper portions of the second grooves H2.

Thereafter, while not shown in a drawing, after forming saddle fin gates in and over the first and second grooves and forming a source region and a drain region in the active region on both sides of each saddle fin gate, by sequentially conducting a series of well-known subsequent processes, the manufacture of a semiconductor device in accordance with the embodiment of the present invention is completed.

Figure 11A:
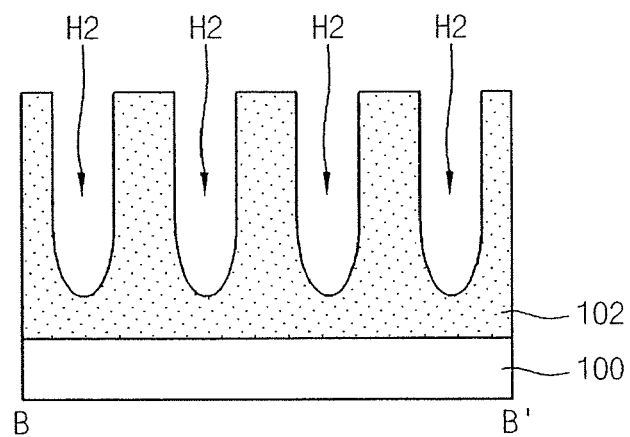
FIGS. 11A through 11C are sectional views taken in correspondence to the line B-B' of FIG. 8, illustrating the processes of a method for manufacturing a semiconductor device in accordance with a sixth embodiment of the present invention.
Figure 11B:
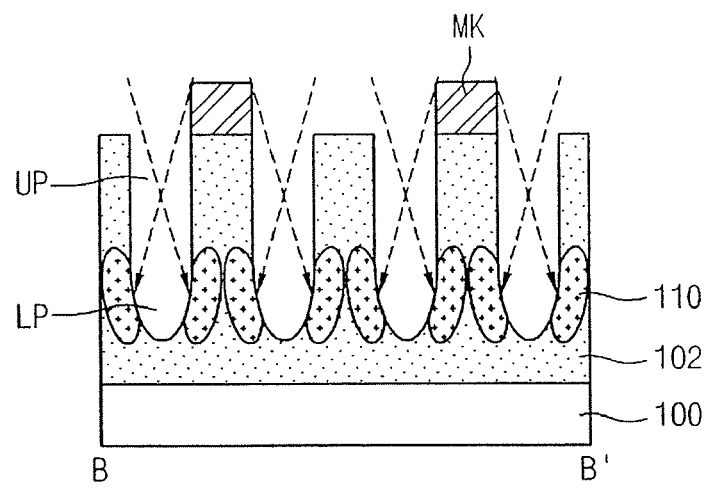
Figure 11C:
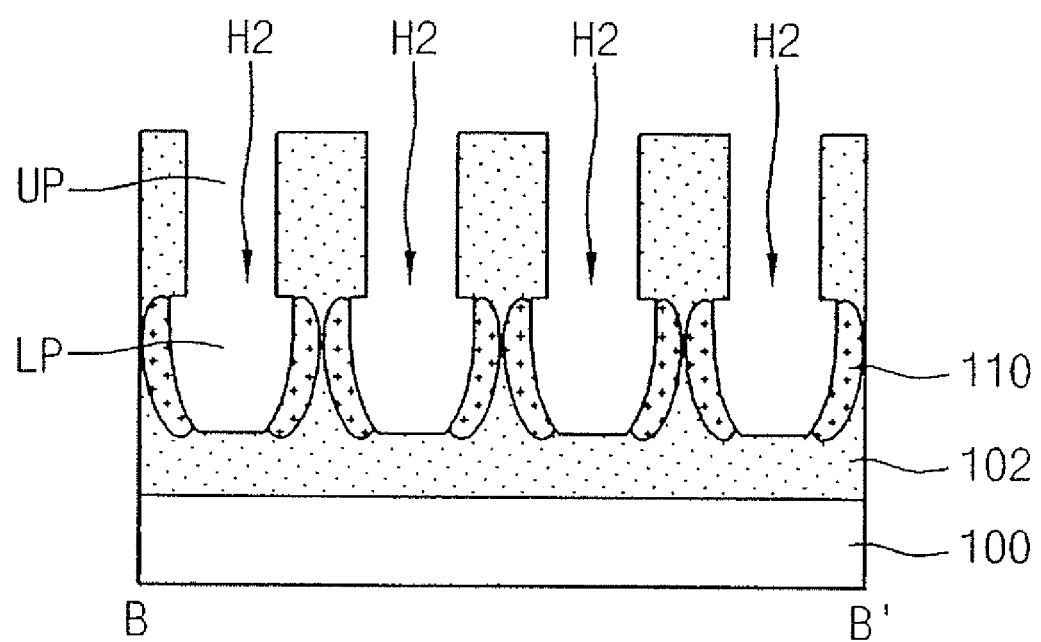

FIGS. 11A through 11C are sectional views taken in correspondence to the line B-B' of FIG. 8, illustrating the processes of a method for manufacturing a semiconductor device in accordance with a sixth embodiment of the present invention.

Referring to FIG. 11A, first grooves are defined by etching gate forming areas of the active region, and second grooves H2 are defined by etching portions of an isolation structure 102.

Referring to FIG. 11B, a mask pattern MK of FIG. 8 is formed on a semiconductor substrate 100 which is defined with the first grooves and the second grooves H2, that exposes portions of the isolation structure 102 which adjoin the active region along the minor axis direction of the active region. Then an ion implantation layer 110 is formed by ion implanting into the exposed portions of the isolation structure 102 that are exposed through the mask pattern MK.

Impurity ions, such as As, P, B, $BF_2$ and F are implanted in a direction tilted with respect to the surface of the semiconductor substrate 100. Also, the impurity ion implantation process is set to have a target ion implantation depth of about 300~2,000 Å in the lower portions of the second grooves H2.

Referring to FIG. 11C, after removing the mask pattern MK, a pre-cleaning process is conducted on the resultant semiconductor substrate 100 which is formed with the impurity ion implantation layer 110. By conducting the pre-cleaning process, portions of the isolation structure 102, which delimit the lower portions of the second grooves H2 placed in the impurity ion implantation layer 110, are selectively etched. As a result, the lower portions of the second grooves H2, which expose the front and rear surfaces of the gate forming areas, result in having a width greater than the upper portions of the second grooves H2.

Thereafter, while not shown in a drawing, after forming saddle fin gates in and over the first and second grooves and forming a source region and a drain region in the active region on both sides of each saddle fin gate, by sequentially conducting a series of well-known subsequent processes, the manufacture of a semiconductor device in accordance with the embodiment of the present invention is completed.

Figure 12:
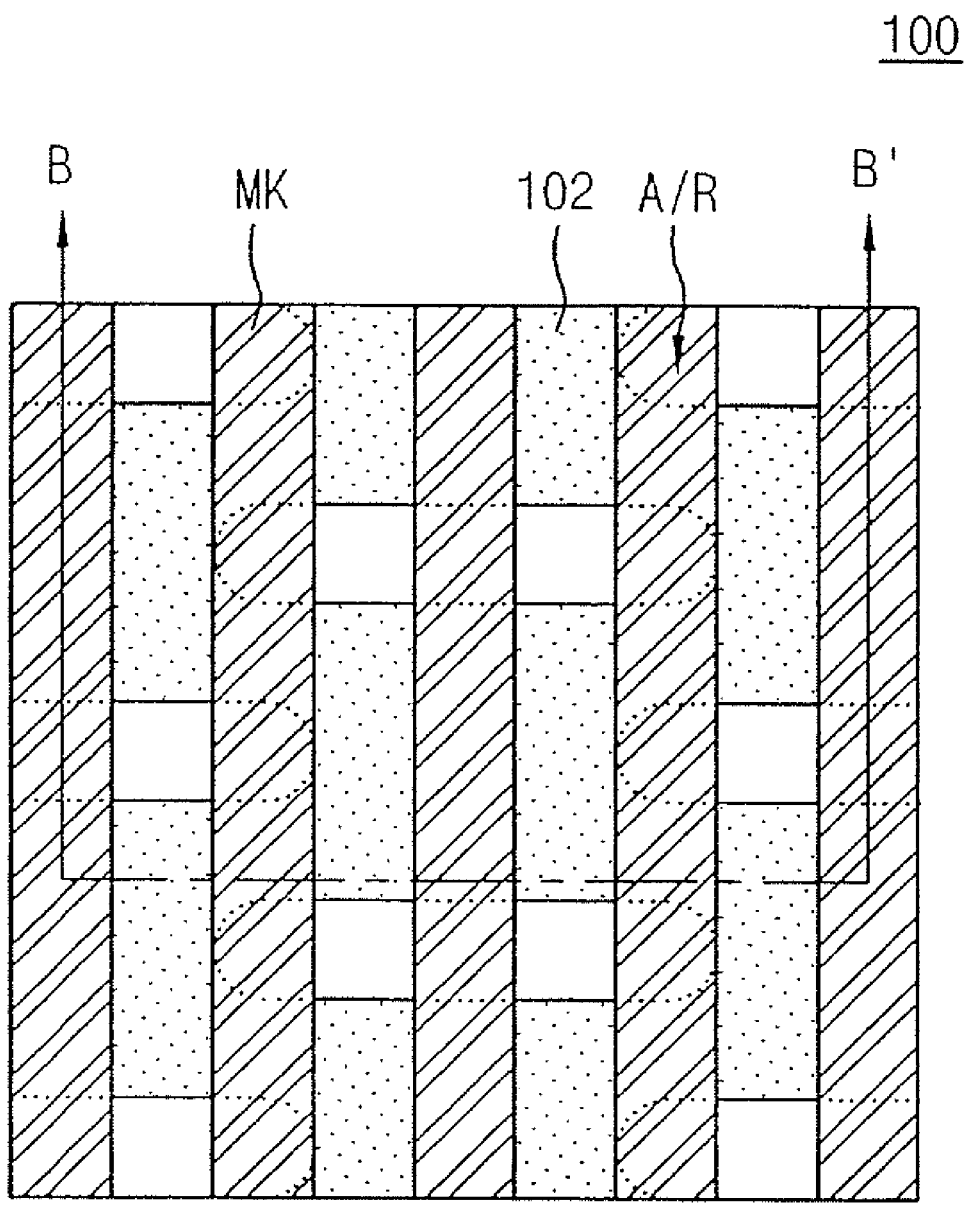
FIG. 12 is a plan view illustrating line type mask patterns which expose first and second grooves and extend along the minor axis direction of active regions.
Figure 13A:
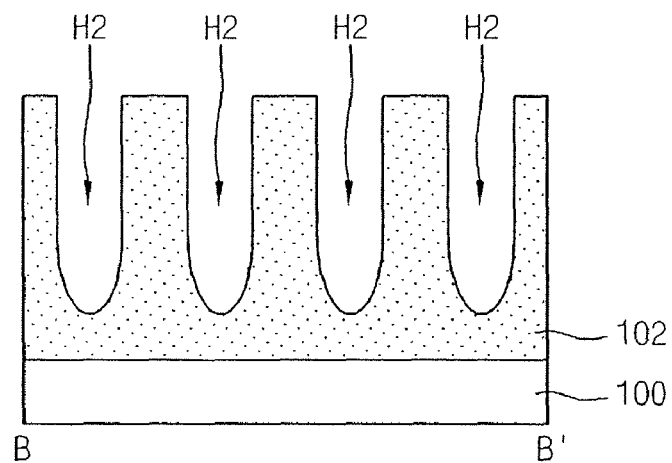
FIGS. 13A through 13C are sectional views taken in correspondence to the line B-B' of FIG. 12, illustrating the processes of a method for manufacturing a semiconductor device in accordance with a seventh embodiment of the present invention.
Figure 13B:
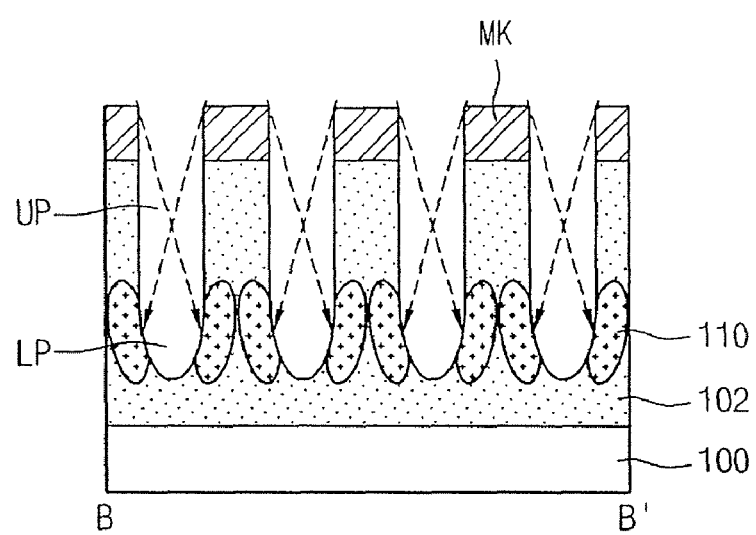
Figure 13C:
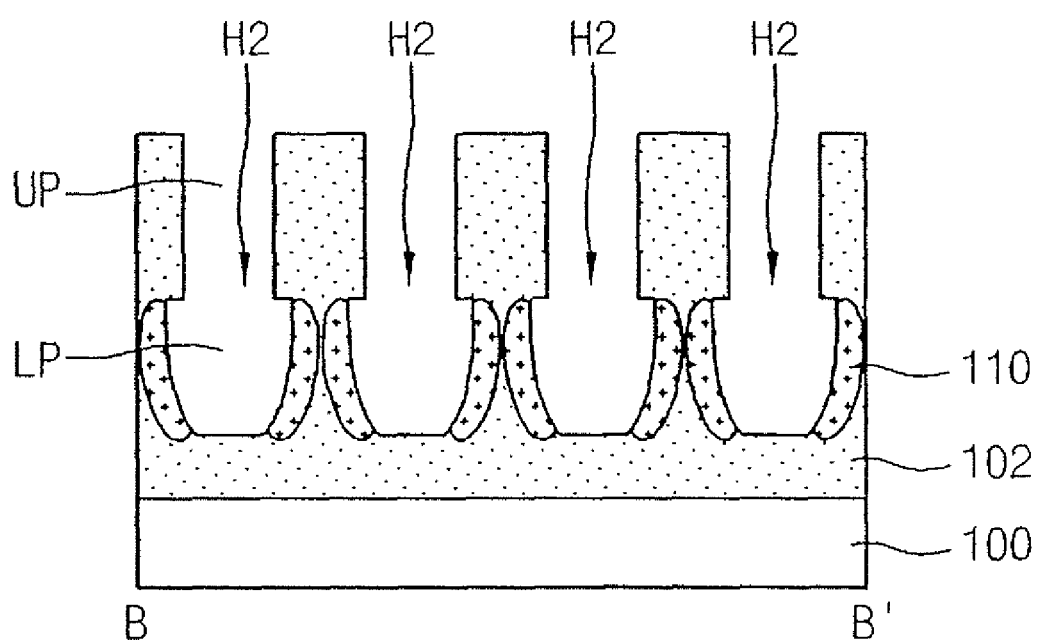

FIG. 12 is a plan view illustrating line type mask patterns that expose first and second grooves and which extend along the minor axis direction of active regions. FIGS. 13A through 13C are sectional views taken in correspondence to the line B-B' of FIG. 12, illustrate some of the processes of a method for manufacturing a semiconductor device in accordance with a seventh embodiment of the present invention.

Referring to FIG. 13A, first grooves are defined by etching gate forming areas of the active region and second grooves H2 are defined by etching portions of an isolation structure 102.

Referring to FIG. 13B, line type mask patterns MK of FIG. 12 are formed on a semiconductor substrate 100 which is defined with the first grooves and the second grooves H2, that exposes the first and second grooves and extends along the minor axis direction of the active region. Then, by conducting an impurity ion implantation process for portions of the isolation structure 102 exposed between the mask patterns MK, an impurity ion implantation layer 110 is formed.

Impurity ions, such as, As, P, B, BF$_2$ and F, are then implanted at a direction tilted away from the perpendicular of the planar surface of the semiconductor substrate. Also, the target ion implantation depth is set at a depth to about 300~2,000 Å so that the impurity ion implantation layer 110 is placed in the lower portions of the second grooves H2.

Referring to FIG. 13C, after removing the mask patterns M K, a pre-cleaning process is conducted on the resultant semiconductor substrate 100 which is formed with the impurity ion implantation layer 110. By conducting the pre-cleaning process, portions of the isolation structure 102, which delimit the lower portions of the second grooves H2 placed in the impurity ion implantation layer 110, are selectively etched. As a result, the lower portions of the second grooves H2, which expose the front and rear surfaces of the gate forming areas, have a width greater than the upper portions of the second grooves H2.

Thereafter, while not shown in a drawing, after forming saddle fin gates in and over the first and second grooves and forming a source region and a drain region in the active region on both sides of each saddle fin gate, by sequentially conducting a series of well-known subsequent processes, the manufacture of a semiconductor device in accordance with the embodiment of the present invention is completed.

Figure 14:
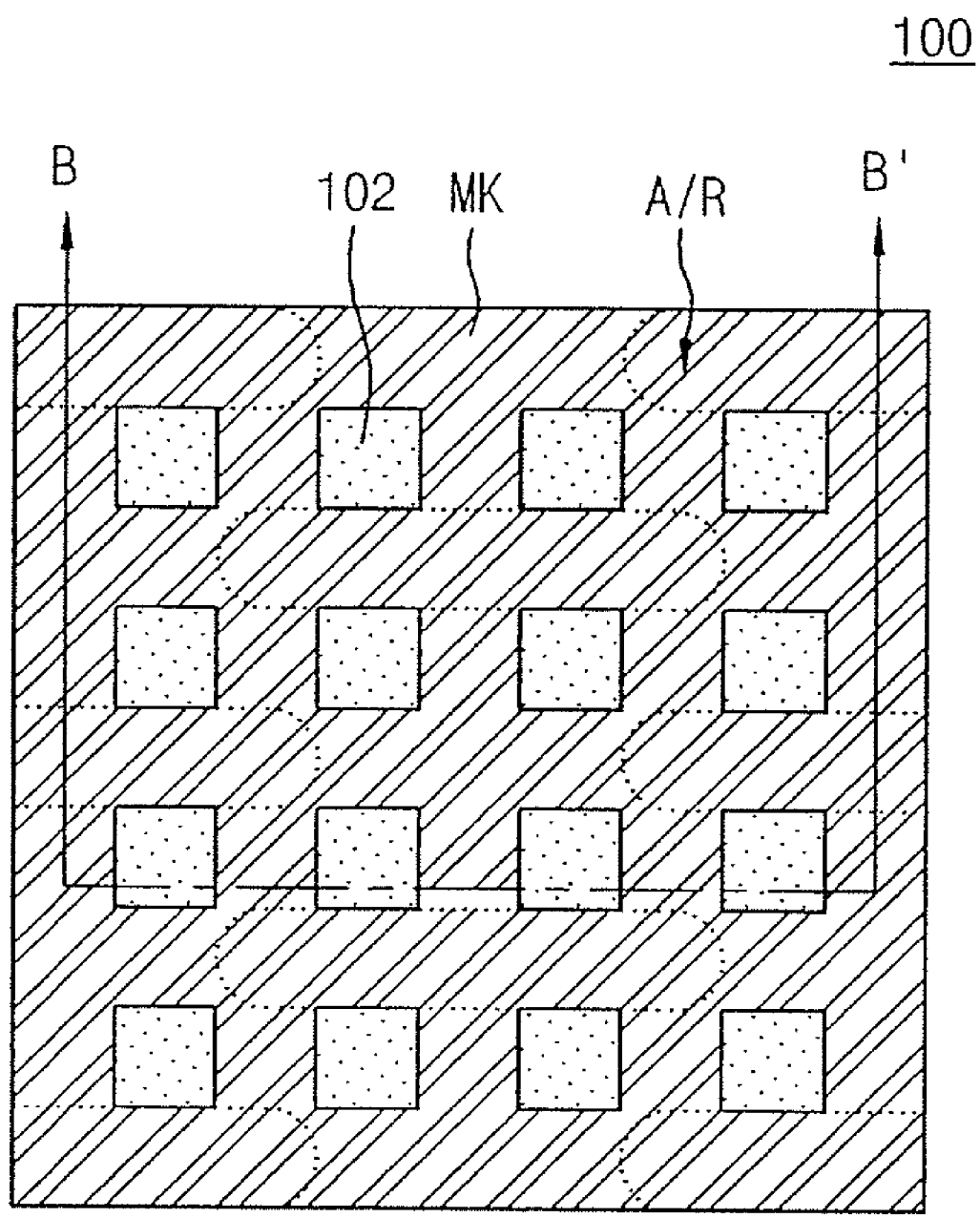
FIG. 14 is a plan view illustrating a mask pattern which exposes second grooves defined in portions of an isolation structure adjoining active regions along the minor axis direction of the active regions.
Figure 15A:
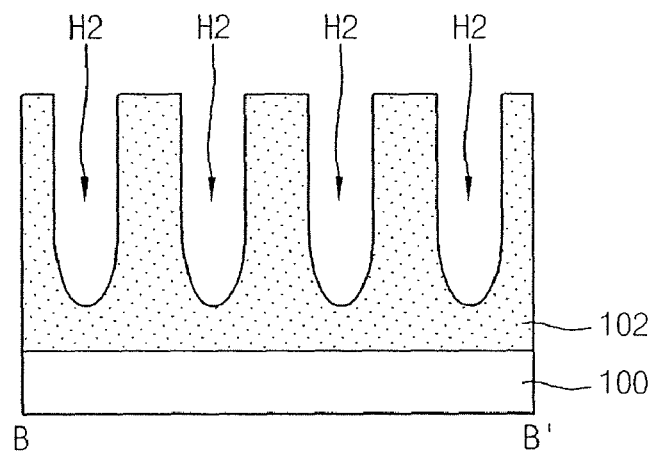
FIGS. 15A through 15C are sectional views taken in correspondence to the line B-B' of FIG. 14, illustrating the processes of a method for manufacturing a semiconductor device in accordance with an eighth embodiment of the present invention.
Figure 15B:
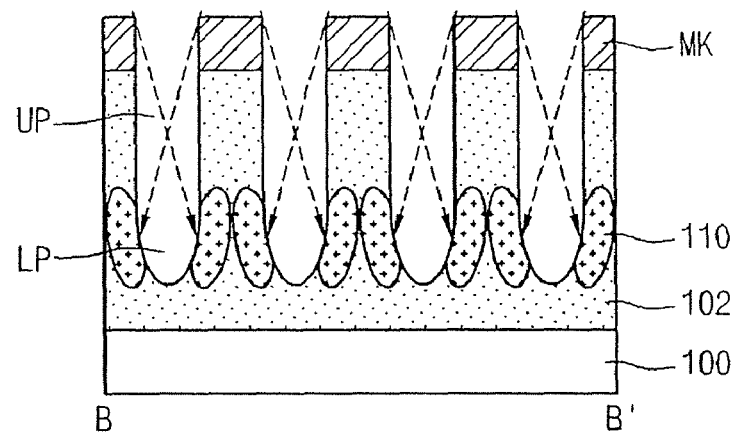
Figure 15C:
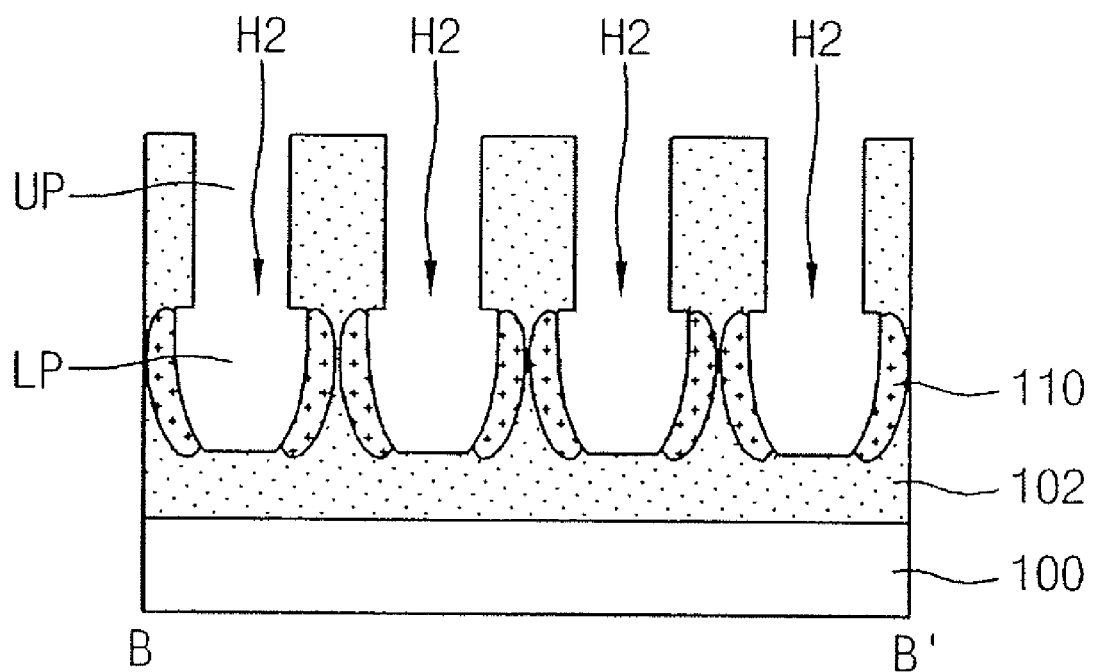

FIG. 14 is a plan view illustrating a mask pattern which exposes second grooves defined in portions of an isolation structure adjoining active regions along the minor axis direction of the active regions, and FIGS. 15A through 15C are sectional views taken in correspondence to the line B-B' of FIG. 14, illustrating the processes of a method for manufacturing a semiconductor device in accordance with an eighth embodiment of the present invention.

Referring to FIG. 15A, first grooves are defined by etching gate forming areas of an active region and second grooves H2 are defined by etching portions of an isolation structure 102.

Referring to FIG. 15B, a mask pattern MK of FIG. 14 is formed on a semiconductor substrate 100 which is defined with the first grooves and the second grooves H2, that exposes second grooves defined in portions of the isolation structure adjoining the active region along the minor axis direction of the active region. Then, impurity ions are implanted into portions of the isolation structure 102 that are exposed through the mask pattern MK to form an impurity ion implantation layer 110.

Impurity ions, such as As, P, B, BF$_2$ and F, are implanted in a direction tilted away from the perpendicular of the planar surface of the semiconductor substrate 100. Also, the impurity ion implantation process is conducted by setting a target ion implantation depth to about 300~2,000 Å in a manner such that the impurity ion implantation layer 110 is placed in the lower portions of the second grooves H2.

Referring to FIG. 15C, after removing the mask pattern MK, a pre-cleaning process is conducted for the resultant semiconductor substrate 100 which is formed with the impurity ion implantation layer 110. By conducting the pre-cleaning process, portions of the isolation structure 102, which delimit the lower portions of the second grooves H2 placed in the impurity ion implantation layer 110, are selectively etched. As a result, the lower portions of the second grooves H2, that expose the front and rear surfaces of the gate forming areas, result in having a width greater than the upper portions of the second grooves H2.

Thereafter, while not shown in a drawing, after forming saddle fin gates in and over the first and second grooves and forming a source region and a drain region in the active region on both sides of each saddle fin gate, by sequentially conducting a series of well-known subsequent processes, the manufacture of a semiconductor device in accordance with the embodiment of the present invention is completed.

Although specific embodiments of the present invention Is have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
   a semiconductor substrate defined with first grooves in gate forming areas;
   an isolation structure formed in the semiconductor substrate and defined with second grooves that are deeper than the first grooves, lower portions of the second grooves expose front and rear surfaces of the gate forming areas so as to form saddle fin patterns; and
   gates formed within the first grooves of the gate forming areas and formed within the second grooves of the isolation structure to cover the exposed front and rear surfaces of the gate forming areas,
   wherein the lower portions of the second grooves which expose front and rear surfaces of the gate forming areas are wider than respective upper portions of the second grooves so as to increase lengths of the saddle fin patterns in the lengthwise direction of channels.

2. The semiconductor device according to claim 1, further comprising an impurity ion implantation layer formed in lower portions of the isolation structure that adjoin the exposed front and rear surfaces of the gate forming areas.

* * * * *